(12) United States Patent
Diaz et al.

(10) Patent No.: US 10,931,040 B1
(45) Date of Patent: Feb. 23, 2021

(54) CONTROLLED-IMPEDANCE CIRCUIT BOARD CONNECTOR ASSEMBLY

(71) Applicant: Ardent Concepts, Inc., Hampton, NH (US)

(72) Inventors: Sergio Diaz, Cambridge, MA (US); Gordon A Vinther, Hampton, NH (US)

(73) Assignee: Ardent Concepts, Inc., Hampton, NH (US)

( * ) Notice: Subject to any disclaimer, the term of this patent is extended or adjusted under 35 U.S.C. 154(b) by 0 days.

(21) Appl. No.: 16/529,580

(22) Filed: Aug. 1, 2019

Related U.S. Application Data

(60) Provisional application No. 62/713,775, filed on Aug. 2, 2018.

(51) Int. Cl.
| | |
|---|---|
| *H01R 9/05* | (2006.01) |
| *H01R 13/405* | (2006.01) |
| *H01R 13/24* | (2006.01) |
| *H01R 13/6581* | (2011.01) |

(Continued)

(52) U.S. Cl.
CPC ....... *H01R 9/0515* (2013.01); *G01R 31/2851* (2013.01); *H01B 11/1895* (2013.01); *H01R 12/714* (2013.01); *H01R 13/2421* (2013.01); *H01R 13/405* (2013.01); *H01R 13/512* (2013.01); *H01R 13/6581* (2013.01);

(Continued)

(58) Field of Classification Search
CPC .. H01R 13/2421; H01R 12/714; H01R 12/75; H01R 13/6473; H01R 24/38; H01R 2201/20; H01R 12/52; H01R 12/79; H01R 13/65912; H01R 13/33; H01R 13/6633; H01R 24/44; H01R 43/00; H01R 9/032; H01R 9/0512; H01R 12/00; H01R 13/24; H01R 13/2414; H01R 13/6477; H01R 13/6592; H01R 13/6595; H01R 2103/00; H01R 24/42; H01R 9/0515

See application file for complete search history.

(56) References Cited

U.S. PATENT DOCUMENTS

| | | | |
|---|---|---|---|
| 6,787,709 B2 * | 9/2004 | Vinther | H01R 13/2421 |
| | | | 174/260 |
| 6,909,056 B2 * | 6/2005 | Vinther | G01R 1/06716 |
| | | | 174/260 |

(Continued)

*Primary Examiner* — Edwin A. Leon
*Assistant Examiner* — Matthew T Dzierzynski
(74) *Attorney, Agent, or Firm* — Altman & Martin; Steven K Martin

(57) ABSTRACT

An assembly for connecting controlled-impedance cables to a PCB using a crescent-shaped connector that can be located much closer to the unit under test than those of the prior art. On the PCB, equal-length signal traces run from UUT contacts to signal pads that form an arc. All signal pads are surrounded by a ground land. The connector has an anchor block for permanently or removably securing the cables. The connector uses skewed coil contacts held within an electrically conductive plate. The signal contacts are captured in signal through apertures within insulating plugs in the plate. The ground contacts are captured in a ground through apertures. Each signal contact is electrically connected to a cable signal conductor and the ground contacts are electrically connected to the anchor block or ferrule. The connector is shaped so that the signal contacts trace an arc, so that they align with the signal pads.

18 Claims, 15 Drawing Sheets

(51) Int. Cl.
*H01R 12/71* (2011.01)
*H01R 13/512* (2006.01)
*H01B 11/18* (2006.01)
*H05K 1/02* (2006.01)
*G01R 31/28* (2006.01)

(52) U.S. Cl.
CPC ........... *H05K 1/025* (2013.01); *H05K 1/0243* (2013.01); *H05K 1/0268* (2013.01); *H05K 2201/09227* (2013.01); *H05K 2201/09418* (2013.01); *H05K 2201/1003* (2013.01); *H05K 2201/10189* (2013.01); *H05K 2201/10356* (2013.01)

(56) References Cited

U.S. PATENT DOCUMENTS

| | | | | |
|---|---|---|---|---|
| 6,951,482 | B1 * | 10/2005 | Miller | H01R 9/0515 |
| | | | | 439/581 |
| 7,019,222 | B2 * | 3/2006 | Vinther | H01R 12/714 |
| | | | | 174/260 |
| 7,126,062 | B1 * | 10/2006 | Vinther | G01R 1/06716 |
| | | | | 174/260 |
| RE41,663 | E * | 9/2010 | Vinther | G01R 1/06716 |
| | | | | 174/260 |
| 8,926,342 | B2 * | 1/2015 | Vinther | H01R 9/032 |
| | | | | 439/79 |
| 9,312,639 | B2 * | 4/2016 | Vinther | H01R 13/6477 |
| RE46,936 | E * | 7/2018 | Vinther | H01R 12/714 |
| RE46,958 | E * | 7/2018 | Vinther | H01R 13/6473 |
| RE47,459 | E * | 6/2019 | Vinther | G01R 1/06772 |
| RE47,460 | E * | 6/2019 | Vinther | H02G 1/14 |

* cited by examiner

CONTROLLED-IMPEDANCE CIRCUIT BOARD CONNECTOR ASSEMBLY

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to electrical cable terminations, more particularly, to controlled-impedance cable terminations which are generally used to transmit high-frequency signals between electronic devices.

2. Description of the Related Art

Integrated circuit manufacturers continually strive to improve the performance of their chips. In the case of a SERDES (serialize and de-serialize) devices, this drives them to create chips that perform this function faster than the previous version. Chip designers release new designs of their chips that can process more of these signals faster. Once a new chip is designed, the designers fabricate the chip and then test it to see that it performs as compared to the design requirements originally set forth in the design criteria. Any given chip may have several SERDES channels that need to be characterized and tested.

To test the chips, the device is mounted to a PCB and then the communication channels are routed to instrumentation that indicates the highest operating frequency of the chip through a range of stimuli and conditions. It is important to the designers that the PCB and routing do not degrade the performance readings of the new device. Since all passive transmission lines are parasitic and degrade signals, especially copper lines, it is desirable to keep the routing as short and the least parasitic as possible. Any added length in the transmission line routing will show a degraded performance, however subtle, of the actual device or chip itself. It is also important that ALL of the passive routing lines exhibit the same parasitics as the surrounding routing lines. That means all routing lines from the chip or device to the characterization equipment should be as short as possible and of equal length to each other.

In an effort to keep these routing lines as short and possible and equal in length, methods of the prior art route the PCB traces so they radiate out from the device in an arc. The opposite ends of each trace are coupled to a connector that transfers the signal to a coaxial cable to travel to the test instrument. The connectors that couple to the traces are generally single-signal connectors like subminiature push-on connectors (SMPs) or singular surface or edge launch subminiature version A connectors (SMAs) and subminiature version K (2.92 mm) connectors (SMKs).

The problem with this approach is that the singular connectors mentioned above are so physically large that it requires longer trace routing to the connector to fit all the connectors on the PCB.

BRIEF SUMMARY OF THE INVENTION

The present invention is an assembly for connecting controlled-impedance cables to a PCB using a crescent-shaped, controlled-impedance connector that can be located much closer to the unit under test (UUT) than those of the prior art. The assembly includes a connector pair, with a PCB component and a connector.

In the PCB component, equal-length signal traces run from the contacts of a UUT to signal pads. The spacing between UUT contacts is very small, on the order of 0.5 mm to 1 mm, whereas between signal pads depends on the spacing needed between the coaxial cables carrying signals between the connector and test instruments. In order to have enough separation between signal pads, the traces spread out from the UUT to the signal pads. Optionally, it may be necessary for the signal trace to run parallel to each other from the UUT before spreading out, thereby requiring a bend in the trace. Because the traces are of equal length, the signal pads form an arc. Because the signal traces do not radiate from a single point, but from a line of UUT contacts, the arc does not have a constant radius. However, the arc will always curve in the same direction.

All of the signal pads are nearly completely surrounded by a ground land. A break in the ground land permits the signal trace to pass through. Alternatively, the ground land completely surrounds the signal pad and the signal trace reaches the signal pad through a different layer of the PCB.

The connector provides an interface between one or more controlled-impedance coaxial cables that have a signal conductor surrounded by a dielectric with a ground reference shield outside the dielectric. The connector has several embodiments, each of which has an anchor block for securing the cables, compliant signal contacts for making an electrical connection between the cable signal conductors and the PCB, optional compliant ground contacts for making an electrical connections between the cable shields and the ground plane of the PCB, and a plate mounted to the anchor block that holds the contacts.

In one configuration, the anchor block is conductive and provides a common ground for the cables that are permanently attached. Once the cables are anchored in the anchor block, the face of the anchor block, the signal conductors, and the dielectrics are properly dressed to make a reliable electrical connections with the compliant contacts.

In another configuration, the anchor block is either conductive or nonconductive and merely provides an anchor for the cables that are removably attached using a ferrule that is attached at or near the end of the cable to the shield. The ferrule face, signal conductor, and dielectric are dressed. The ferrule can attach to the anchor block by being threaded and turned into a threaded hole in the anchor block. The ferrule can attach to the anchor block by a twist-lock mechanism. The ferrule can attach to the anchor block by capturing it between two parts of the anchor block.

The connector of the present invention uses skewed coil contacts that are held within the plate, which is electrically conductive. The signal contacts are captured in through apertures within insulating plugs in the plate. The ground contacts are captured in a ground through apertures. The conductive plate electrically couples the ground contacts together. After the plate is assembled to the anchor block, each signal contact is electrically connected to a cable signal conductor and the ground contacts are electrically connected to the anchor block or ferrule. The signal contacts and ground contacts extend from the device side of the plate.

The connector is removably attached to the PCB, typically by jack screws. The jack screws may not compress the connector and PCB together linearly. So, the compliant contacts facilitate an adequate connection between the cables and the PCB, compensating for noncoplanarities in the signal pads and ground land.

The connector is shaped so that the signal contacts are aligned with the signal pads. Consequently, the signal contacts trace an arc that is identical to the arc of the signal pads.

Objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein.

DETAILED DESCRIPTION OF THE INVENTION

The present application hereby incorporates by reference in its entirety U.S. Provisional Patent Application No. 62/713,775, on which this application is based.

The present invention is an apparatus and method for connecting controlled-impedance cables to a PCB. The present invention employs a crescent-shaped, controlled-impedance connector that can be located much closer to the unit under test (UUT) than those of the prior art. The closer proximity yields shorter, equal-length traces, thus enhancing the measured performance of a device that transmits or receives data.

Figure 1:
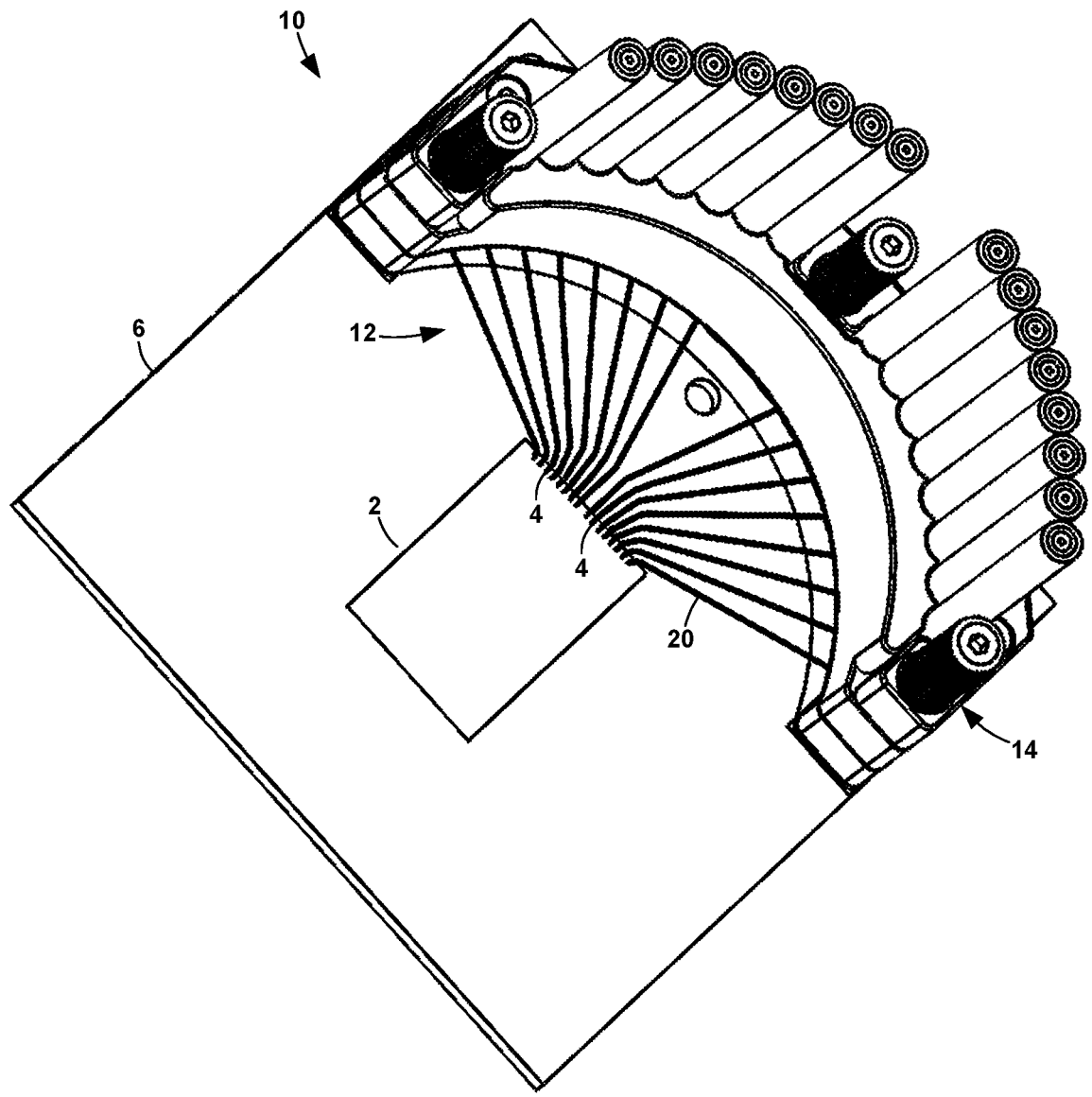
FIG. 1 is a perspective view of the connector assembly of the present invention in the connected state.
Figure 2:
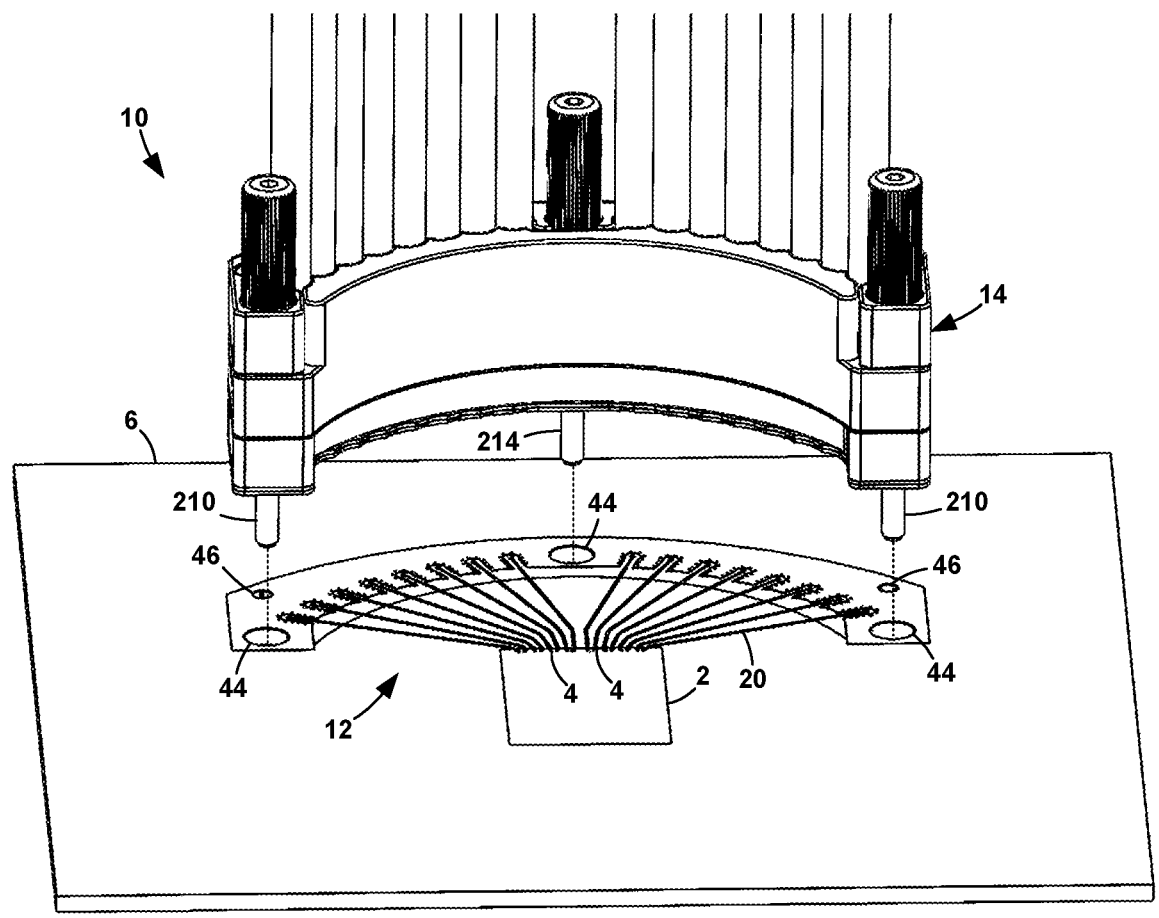
FIG. 2 is a perspective view of the connector assembly of the present invention in the disconnected state.

The present invention includes a connector pair 10, with a PCB component 12 and a connector 14, as shown in FIGS. 1 and 2.

Figure 3:
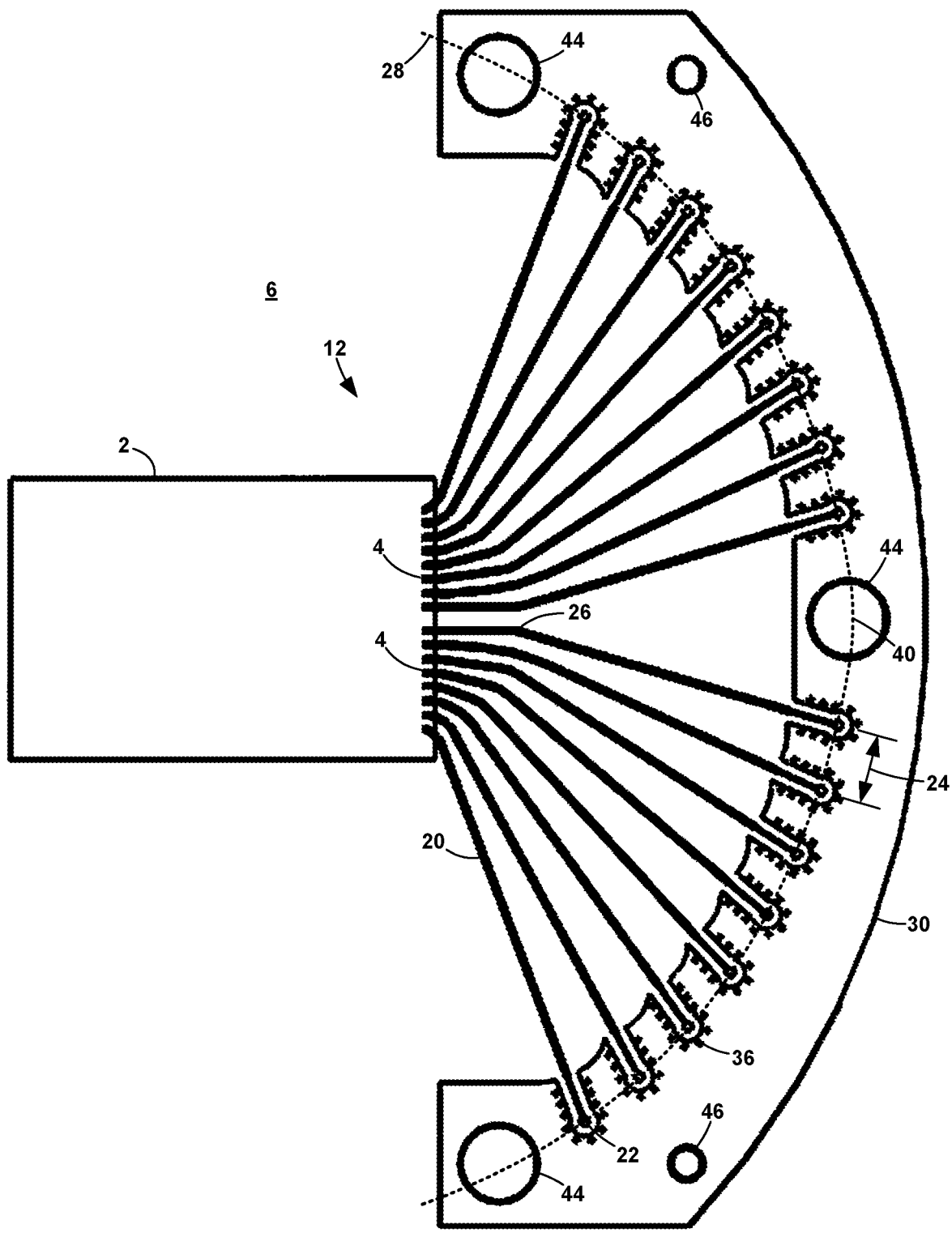
FIG. 3 is a top view of one configuration of the PCB component of the present invention.
Figure 4:
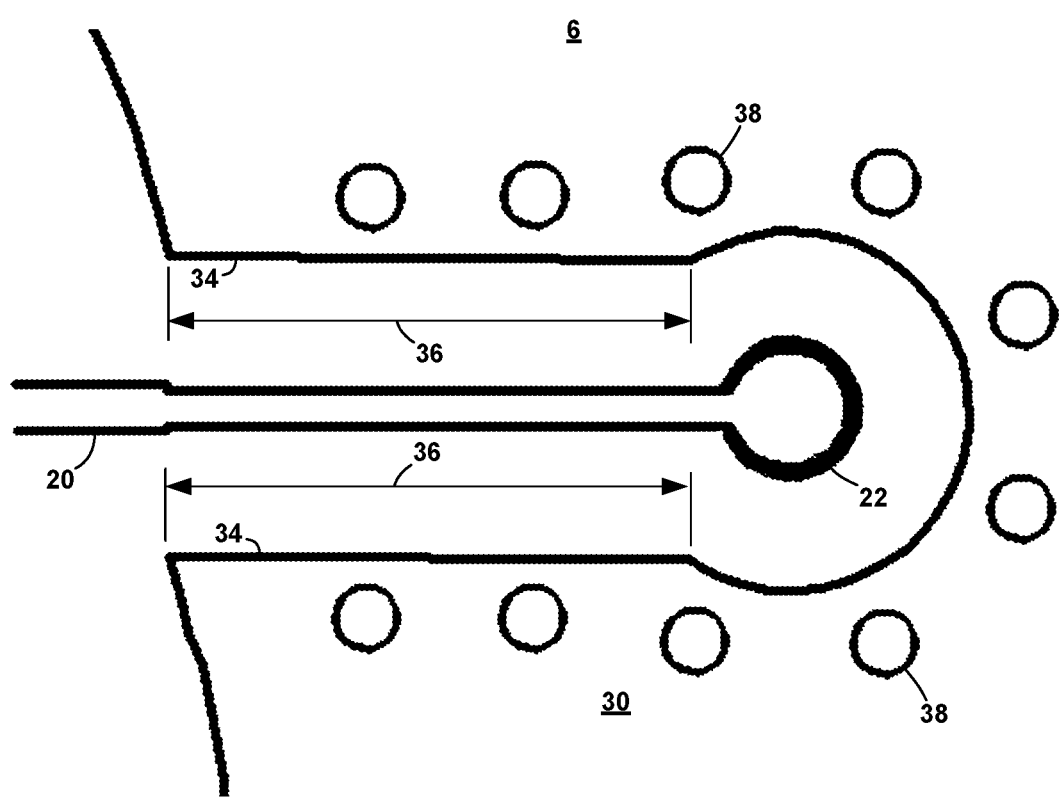
FIG. 4 is a detail view of the configuration of FIG. 3.
Figure 5:
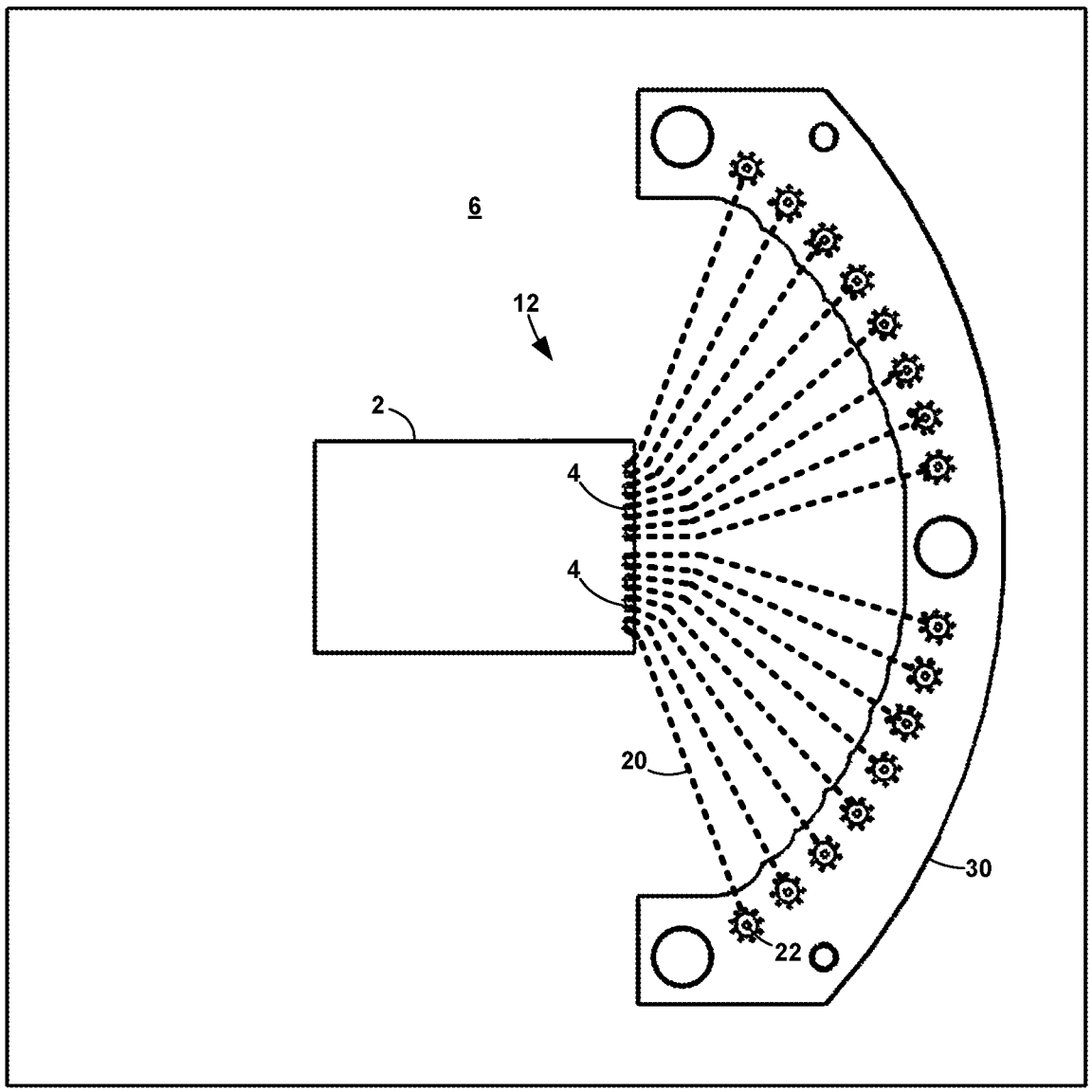
FIG. 5 is a top view of another configuration of the PCB component of the present invention.
Figure 6:
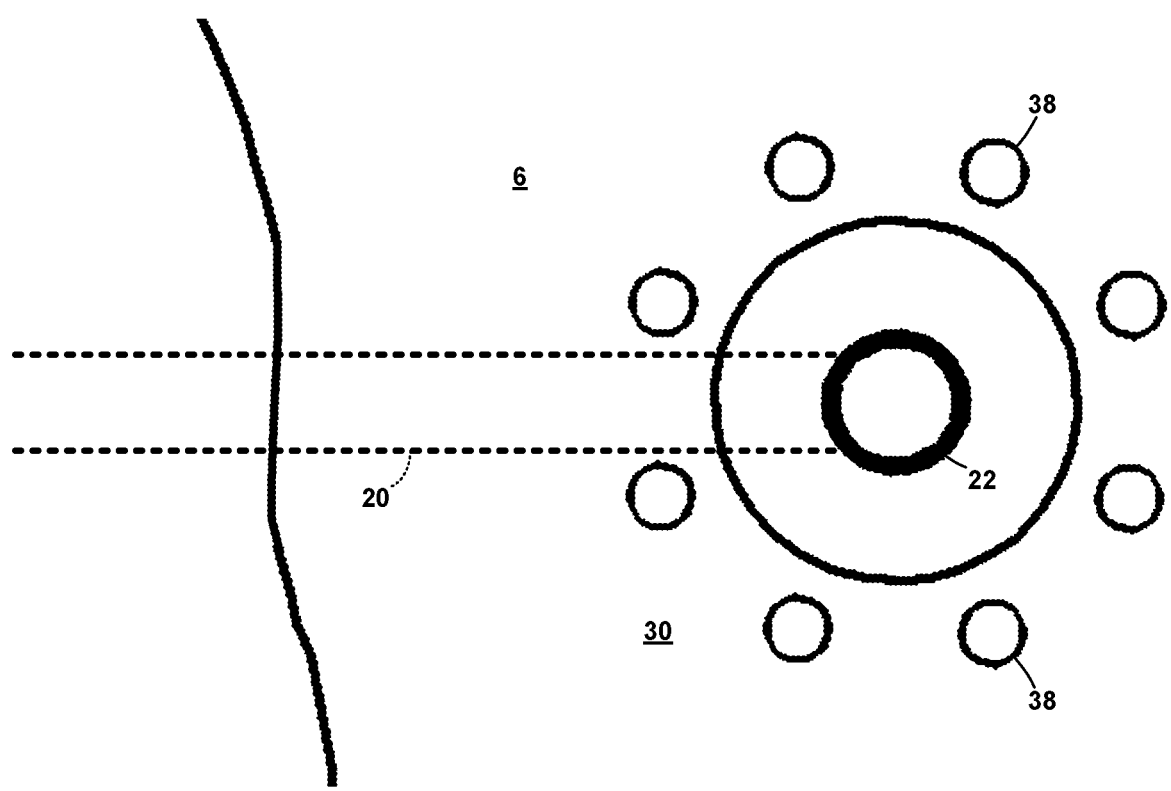
FIG. 6 is a detail view of the configuration of FIG. 5.
Figure 7:
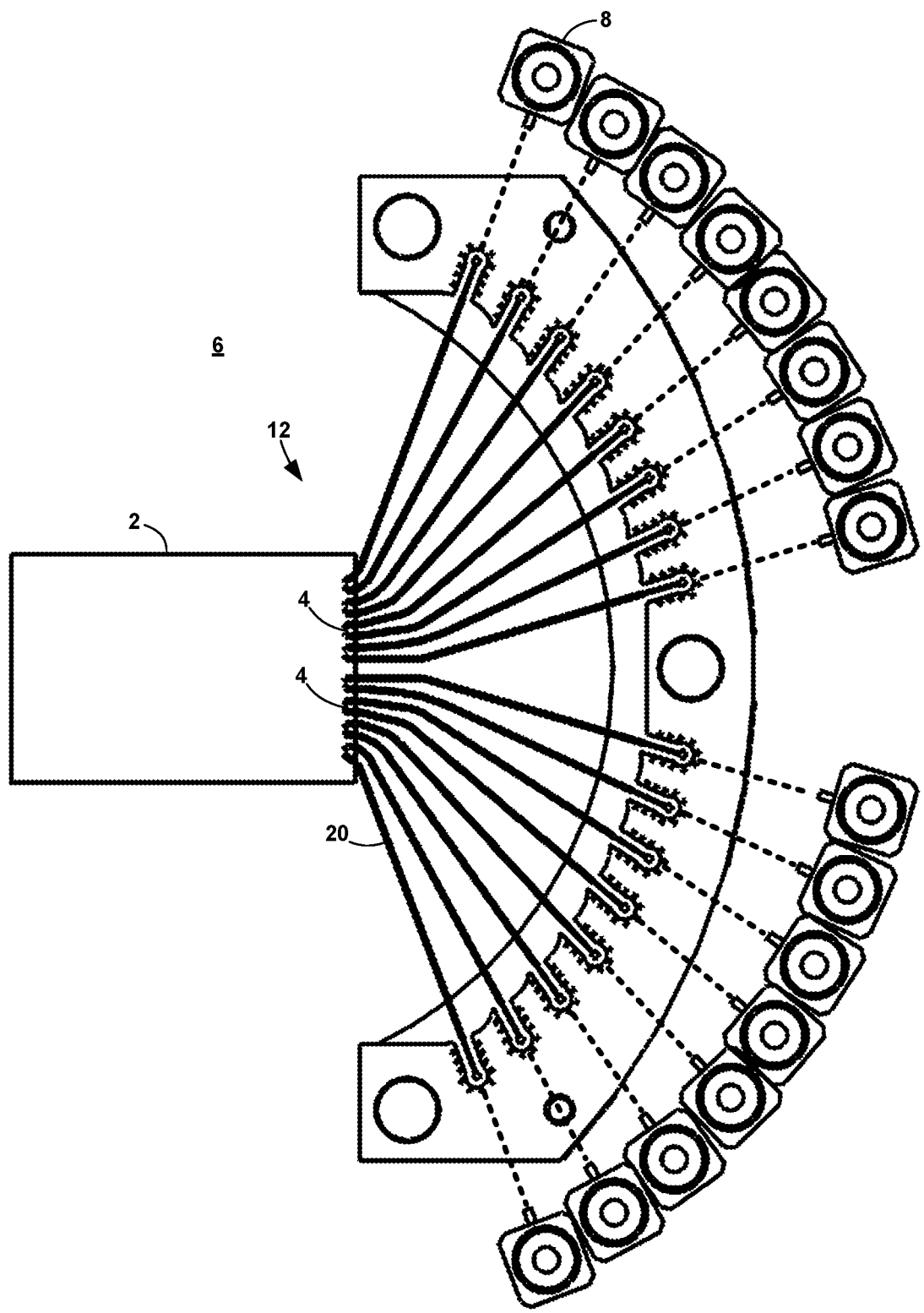
FIG. 7 is a top view of the PCB component configuration of the present invention compared to the prior art.
Figure 8:
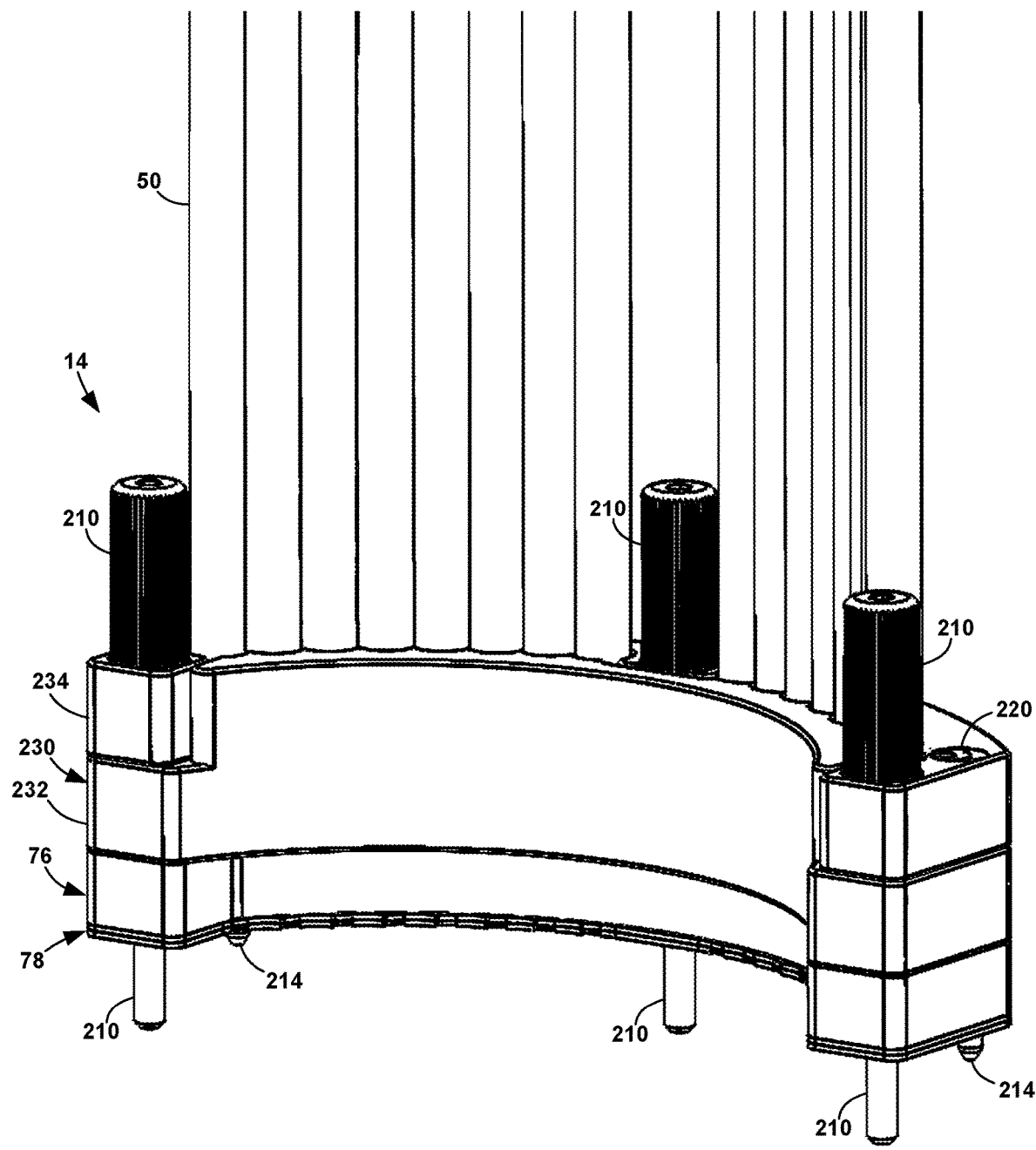
FIG. 8 is a perspective view of the connector of the present invention with cables.

The PCB component is shown in FIGS. 3-5. A signal trace 20 runs from each contact 4 of a UUT 2 to a signal pad 22. All of the traces 20 are the same length so the propagation times are the same for all signals. In the design illustrated in the figures, the trace lengths are ⅞". In the prior art using SMPs 8, the SMPs 8 are so large that, even when touching, as shown in FIG. 6, the trace lengths are 1⅜". The present invention decreases trace lengths by ½", a reduction of 36%.

The spacing between UUT contacts 4 is very small, on the order of 0.5 mm to 1 mm. The spacing 24 between signal pads 22 depends on the spacing needed between the discrete coaxial cables 50 carrying signals between the connector 14 and test instruments and the desire to keep the signal traces 20 as short as possible. In the current case, the distance between connectors is 0.15". In the case with the SMPs as prior art, the minimum distance between connectors is 0.25". In order to have enough separation between signal pads 22 for discrete coaxial cables, the signal traces 20 spread out from the UUT 2 to the signal pads 22. Optionally, it may be necessary for the signal trace 20 to run away somewhat perpendicularly from the UUT 4 before spreading out, as in FIG. 3, thereby requiring a bend 26 in the signal trace 20.

Because of the desire to maintain equal lengths for all of the signal traces 20, the signal pads 22 form an arc 28, as seen in FIG. 3. In order to form an arc 28, there must be at least three signal pads 22. Because the signal traces 20 do not radiate from a single point, but from a line of UUT contacts 4, the arc 28 does not have a constant radius but is approximately oval. The actual shape of the arc 28 depends, for the most part, on the spacing between UUT contacts 4, the spacing 24 between the signal pads 22, and the angle and path taken by the signal traces 20, including whether or not there are any bends 26 in the traces 20.

In FIG. 3, the signal traces 20 extend symmetrically from the UUT 2, which means that the signal pads 22 form an arc 28 that is symmetrical about its center 40. The present invention contemplates that the signal traces 20 do not have to be symmetrical about the UUT 2, meaning that the arc 28 of the signal pads 22 does not have to be symmetrical about its center. However, the arc 28 will always curve in the same direction.

As shown in FIGS. 3 and 4, all of the signal pads 22 are nearly completely surrounded by a ground land 30. The ground land 30 follows the arc 26 of the signal pads 22. A break 32 in the ground land 30 permits the signal trace 20 to pass through to the signal pad 22. As seen in FIG. 4, the break 32 is designed so that the ground land edges 34 that are parallel to the signal trace 20 are the same length 36 in order to minimize effects on the impedance.

Alternatively, as shown in FIGS. 5 and 6, the ground land 30 completely surrounds the signal pad 22 and the signal trace 20 reaches the signal pad 22 through a different layer of the PCB 6.

Vias 38 connect the ground land 30 to inner ground layers of the PCB 6.

As seen in FIG. 3, the PCB 6 has several round holes 44, 46 for the connector 14. Several of the holes 44 are for attaching the connector 14 and the remainder of the holes 46 are for alignment. The holes 44, 46 are described in more detail below.

The connector 14, shown in FIGS. 1, 2, and 8-15, provides an interface between controlled-impedance coaxial cables (hereinafter, simply "cable") 50 and the PCB 6. Different configurations of the connector 14 are described in U.S. Pat. Nos. 8,926,342 and 9,160,151, both of which are incorporated herein by reference. Several of the configurations are summarized below.

A coaxial cable 50 has a signal conductor 52 surrounded by a dielectric 54 with a ground reference shield 56 outside the dielectric 54. Optionally, a sheath 58 covers the shield 56. A twin-axial cable 50 has two signal conductors 52 surrounded by a dielectric 54 with a ground reference shield 56 outside the dielectric 54 and a sheath 58 covering the shield 56. Cables 50 with more than two signal conductors 52 are available. Although not specifically described, the present invention can be adapted to accommodate cables 50 having any number of signal conductors 52.

The connector 14 has several embodiments, each of which has an anchor block 76 for securing the cables 50, compliant signal contacts 72 for making electrical connections between the cable signal conductors 52 and the PCB 6, optional compliant ground contacts 74 for making electrical connections between the cable shields 56 and the ground plane of the PCB 6, and a plate 78 mounted to the anchor block 76 that holds the contacts 72, 74.

Figure 10:
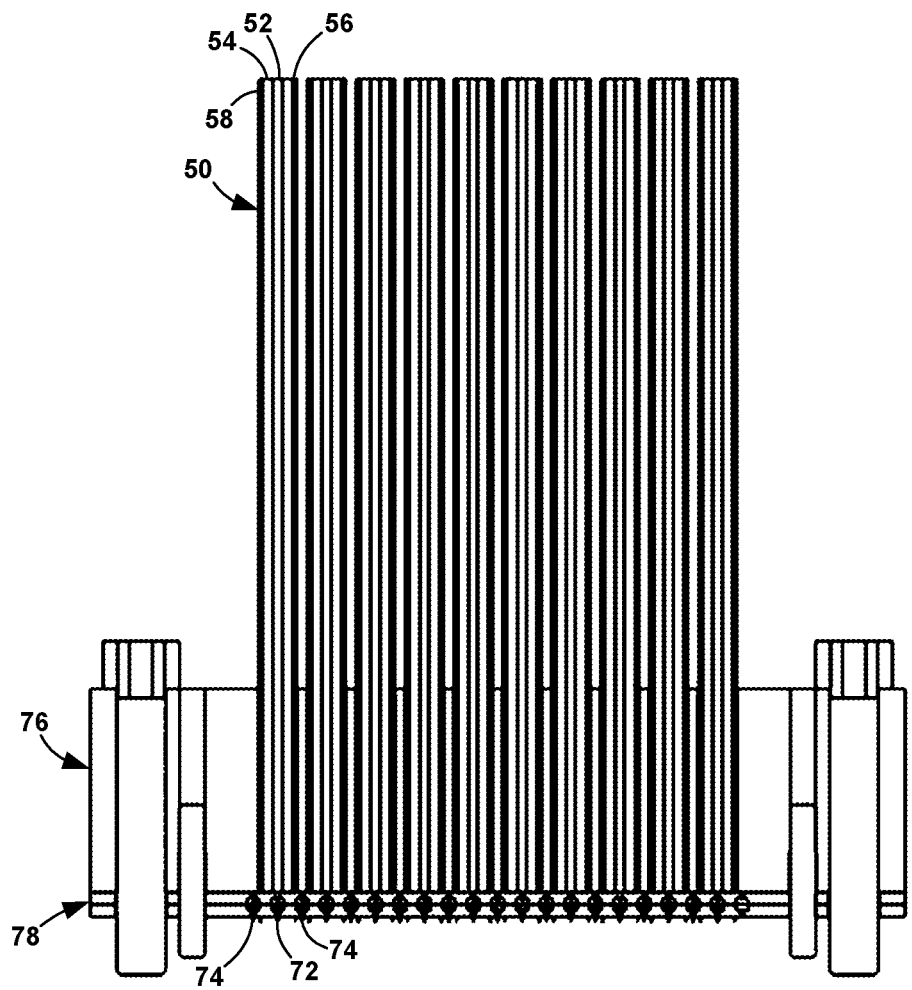
FIG. 10 is a cross-sectional view of a section of a configuration of the connector with permanently attached cables.

In one configuration, the anchor block 76 is conductive and provides a common ground for the cables 50 that are permanently attached, as in FIG. 10. The ground shields 56 of all of the cables 50 are electrically connected to the anchor block 76 in holes 80 in the anchor block 76. Any adequate method can be used, including soldering, crimping, potting with a conductive adhesive, insert molding the anchor block 76 with the cable 50 in place at the time of molding, and press fitting a rigidized, for example, pre-tinned, ground shield 56 into the hole 80.

Once the cables 50 are anchored in the anchor block 76, the face 82 of the anchor block 76, the signal conductors 52, and the dielectrics 54 are properly dressed to make reliable electrical contacts with the compliant contacts 72, 74. The anchor block face 82, signal conductor 52, and dielectric 54 may need to be polished and planarized by some mechanical means, such as by milling, grinding, or sanding, in order to make sure that the cable center conductors 52 and dielectrics 54 are positioned at a known depth with respect to the anchor block face 82, in this case flush with the anchor block face 82. The anchor block face 82 and signal conductors 52 may also require noble metal plating to prevent the polished surface from oxidizing or otherwise degrading so as to inhibit acceptable electrical connection of the contacts 72, 74 to the signal conductors 52 and the anchor block 76.

Figure 11:
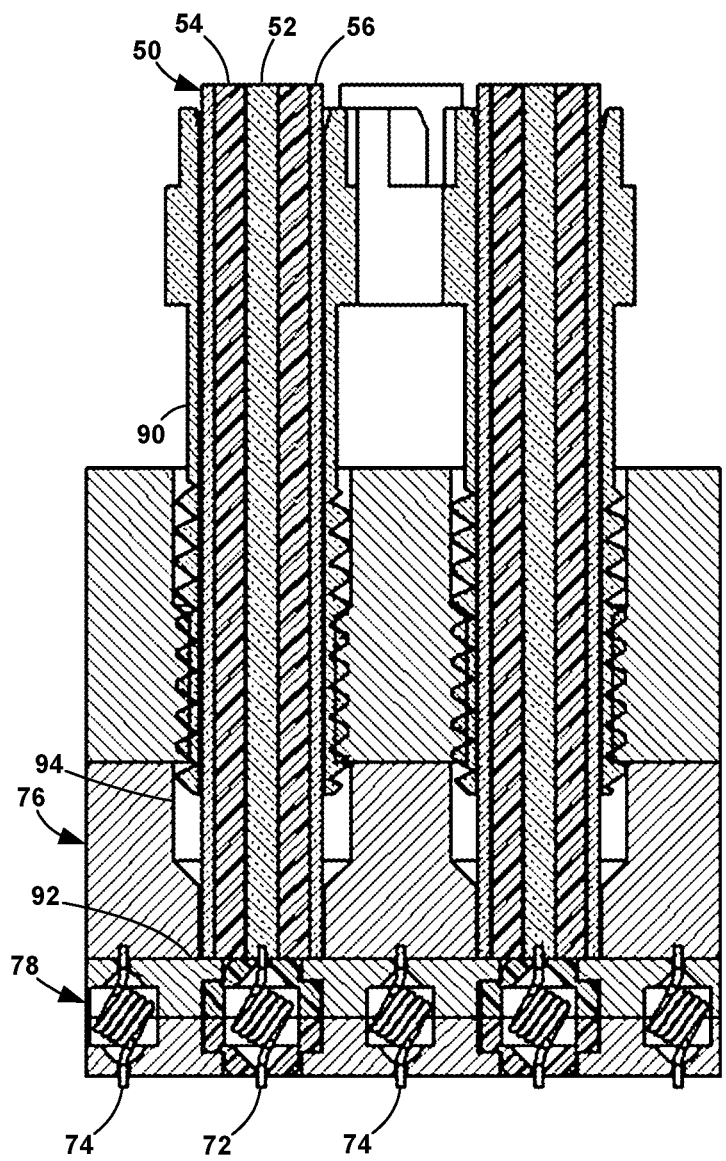
FIG. 11 is a cross-sectional view of a section of a configuration of the connector with removable cables.
Figure 12:
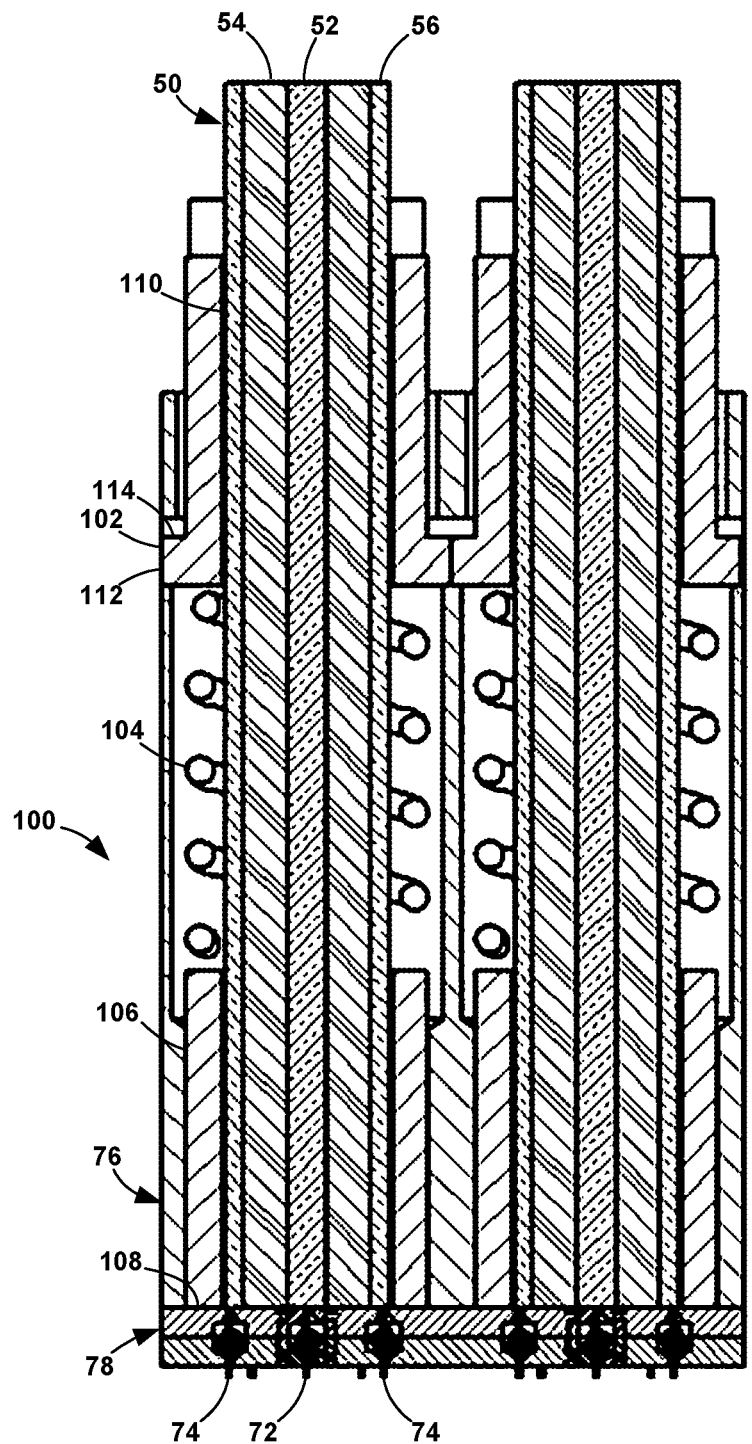
FIG. 12 is a cross-sectional view of a section of another configuration of the connector with removable cables.
Figure 13:
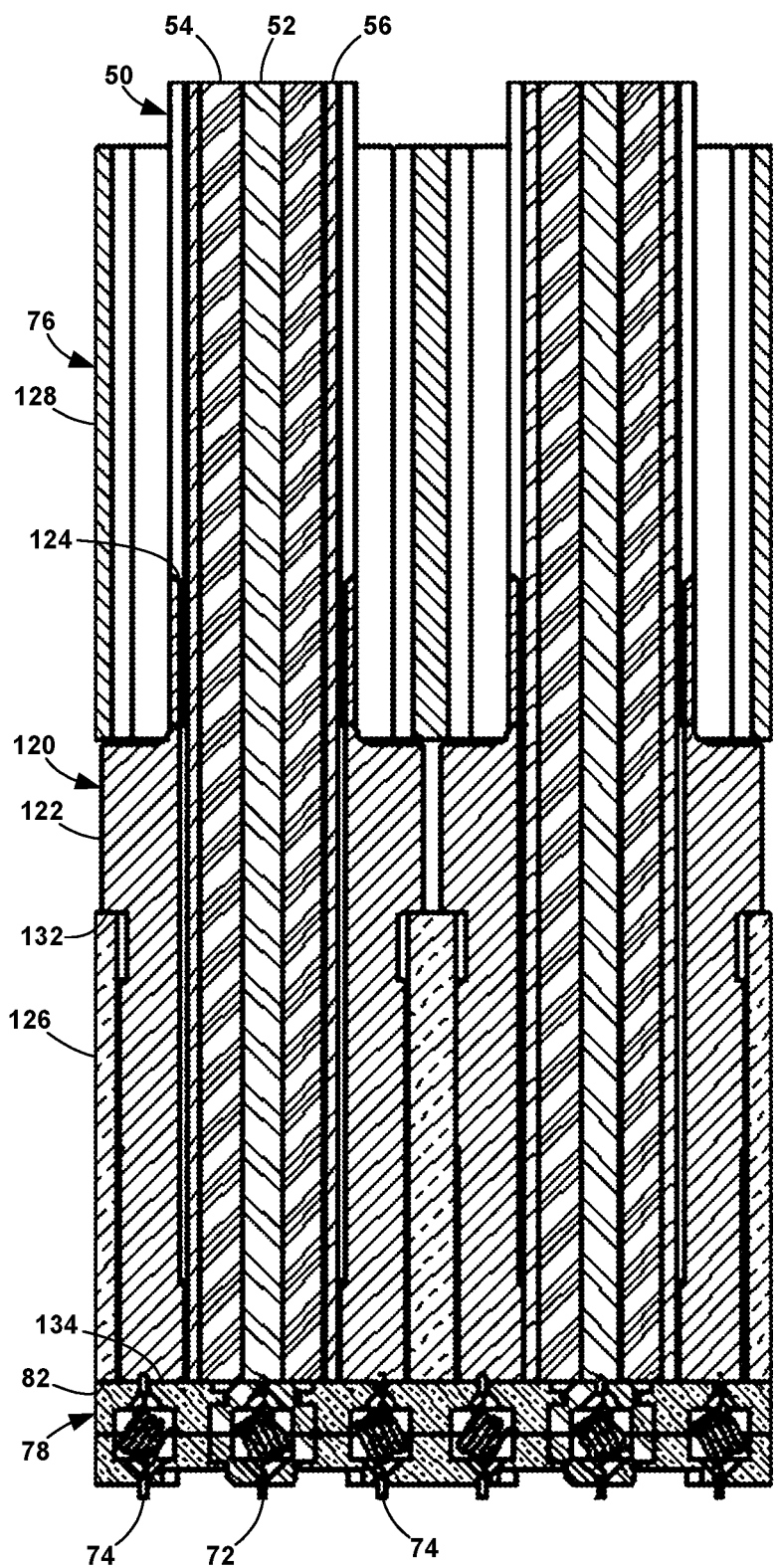
FIG. 13 is a cross-sectional view of a section of another configuration of the connector with removable cables.

In another configuration, the anchor block 76 is either conductive or nonconductive and merely provides an anchor for the cables 50 that are removably attached. Methods of removably attaching the cable 50 to the anchor block 76 are shown in FIGS. 11-13. These methods permit replacement of individual cables 50 so the entire assembly does not have to be replaced.

The first method, shown in FIG. 11, calls for attaching a ferrule at or near the end of the cable 50 for dressing the cable end. The sheath 58 is stripped back and a threaded ferrule 90 is slipped over the shield 56. The ferrule 90 is attached to the cable 50 by soldering, crimping, or other mechanical means that electrically couples the ferrule 90 to the shield 56. The ferrule face 92, signal conductor 52, and dielectric 54 are then dressed as described above with reference to the anchor block 76. The ferrule 90 is threaded into a threaded hole 94 in the anchor block 76 until the signal conductor 52 is pressed against the signal contact 72 in order to produce an electrical connection between the signal conductor 52 and the signal contact 72.

The second method of removably attaching the cable 50 to the anchor block 76 calls for the use of a twist-lock attachment 100, as shown in FIG. 12. A twist-lock component 102 is slipped over the cable 50 such that the component 102 can slide freely over the cable 50. A coil spring 104 is slipped over the cable 50. After the sheath 58 is stripped back, a ferrule 106 is attached to the shield 56 by soldering, crimping, or other mechanical means that electrically couples the ferrule 106 to the shield 56. The ferrule face 108, signal conductor 52, and dielectric 54 are then dressed as described above with reference to the anchor block 76.

The ferrule 106/cable 50 is inserted into a hole 110 in the anchor block 76. Protrusions 112 from the twist-lock component 102 slide down opposed notches, not shown, in the sides of the hole 110 until they align with an annular depression 114 in the hole 110. With this alignment, the spring 104 is compressed so that it presses the signal conductor 52 to the signal contact 72 in order to produce an electrical connection between the signal conductor 52 and the signal contact 72. The twist-lock component 102 is turned so that the protrusions 112 are captured by the annular depression 114, thereby retaining the cable 50 in the hole 110.

Another method of removably attaching the cable 50 to the anchor block 76 is shown in FIG. 13. A ferrule 120 is attached to the cable 50 and dressed as described above. The ferrule 120 has an annular ridge 122 either at the end 124 of the ferrule 120 or away from the end 124, as in FIG. 13. The anchor block 76 has two sections, a bottom section 126 and a top section 128. The upper end of the hole 130 in the bottom section 126 has an annular groove 132. When the ferrule 120/cable 50 assembly is inserted into the hole 130, the ridge 122 fits into the groove 132 with the ferrule face 134, signal conductor 52, and dielectric 54 flush with the block face 82. The block top section 128 is installed on the bottom section 126 and attached via screws, clips, or any other acceptable method. The top section 126 captures the ferrule 120/cable 50 assembly in the anchor block 76. Optionally, the ridge 122 and groove 132 can be keyed to prevent the ferrule 120/cable 50 assembly from rotating in the hole 130.

In some situations, particularly with removable attachments, the signal conductor 52 and/or dielectric 54 may not be exactly flush with the anchor block face 82, that is, it may be slightly recessed into or protruding from the anchor block face 82. That recession or protrusion can be as much as 0.05 inch. The present specification and claims use the term, "flush", to indicate that the signal conductor 52 and dielectric 54 are actually flush with, slightly recessed into, or slightly protruding from the anchor block face 82 by as much as 0.05 inch.

Figure 9:
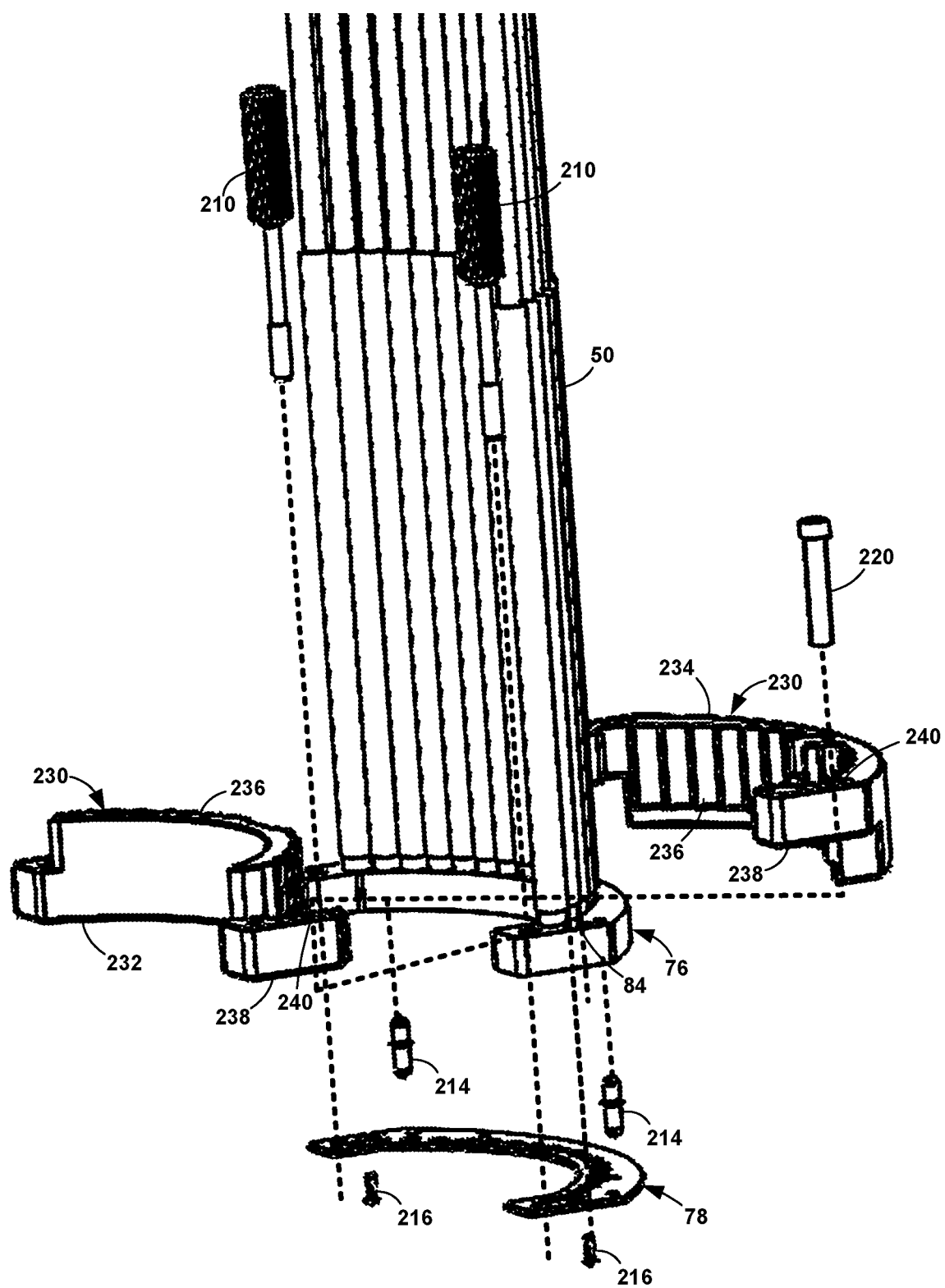
FIG. 9 is an exploded view of the connector with cables.

The connector 14 of the illustrated design has a strain relief 230. As seen in FIG. 9, the strain relief 230 has an inner clamp 232 and an outer clamp 234. The clamps 232, 234 have mating grooves 236 that surround each cable 50. Each clamp 232, 234 has a pair of hooks 238 that snap around the other clamp 232, 234.

The strain relief 230 has several aligned mounting holes 240 in the clamps 232, 234 that accept mounting screws 220. The mounting screws 220 fit through the mounting screw holes 240 in the strain relief 230 and turn into threaded strain relief mounting holes 84 in the anchor block 76 to secure the strain relief 230 to the anchor block 76.

The connector 14 of the present invention is designed to use skewed coil contacts. Skewed coil contacts of various types and configurations are described in U.S. Pat. No. 7,126,062 and Re41,663, both of which are incorporated herein by reference. Briefly, the skewed coil contact includes a coil of conductive, inherently elastic wire with a pair of oppositely extending leads. The leads extend in a direction angled from the coil axis. During compression, the coil loops are electrically shorted together while they slide along each other.

Figure 14:
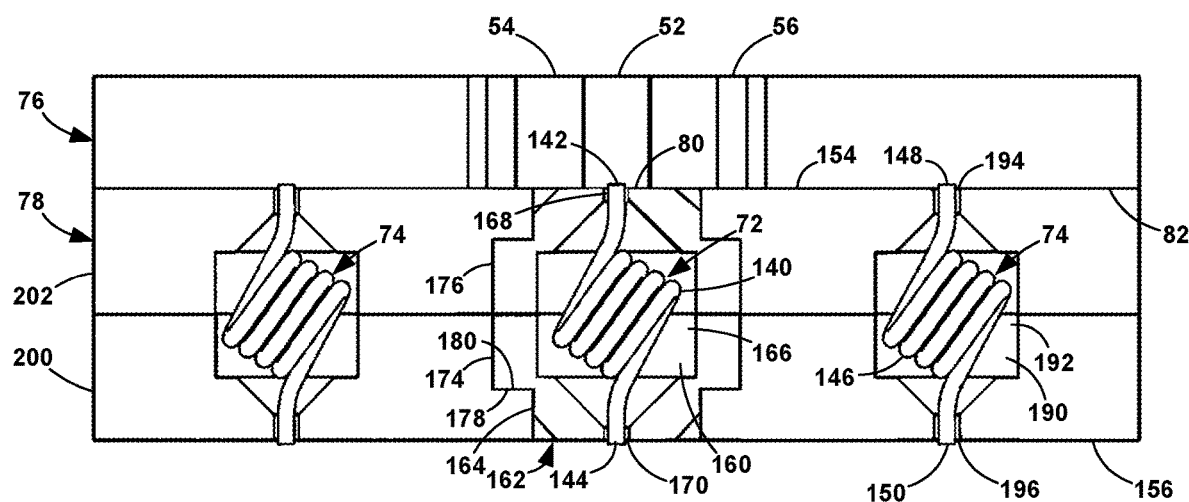
FIG. 14 is a cross-sectional view of one configuration of the plate with a portion of the anchor block and cable.
Figure 15:
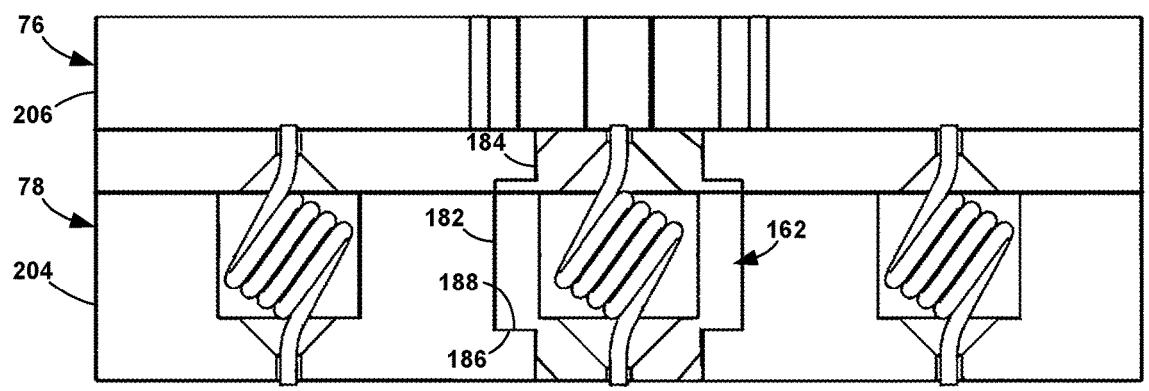
FIG. 15 is a cross-sectional view of another configuration of the plate with a portion of the anchor block and cable.

The plate 78, shown in FIGS. 14 and 15, holds the contacts 72, 74 and is composed of an electrically conductive material. The plate 78 electrically couples the ground contacts 74, thus providing more precise impedance matching to the signal contact 72.

The plate 78 has a block surface 154 that abuts the anchor block face 82 when the connector 14 is assembled and a PCB surface 156 that generally abuts the PCB 6 when the connector 14 is connected to the PCB 6. Typically, the plate 78 is attached to the anchor block face 82 by screws 216.

As shown in FIG. 14, the signal contact 72 is captured in a through aperture 160 in the plate 78. Because the plate 78 is conductive, the signal through aperture 160 is within an insulating plug 162 that prevents the signal contact 72 from electrically shorting to the plate 78. The plug 162 is typically made from an insulating plastic. The plug 162 fits in a signal through hole 164 in the plate 78. The signal through aperture 160 has a larger center section 166 that narrows to a smaller signal block opening 168 in the block surface 154 and to a smaller signal PCB opening 170 in the PCB surface 156. The coil 140 of the contact 72 is captured in the center section 166. Prior to assembling the plate 78 to the anchor block 76, the block contact point 142 of the signal contact 72 extends from the signal block opening 168. Prior to connecting the connector 14 to the PCB 6, the PCB contact point 144 of the signal contact 72 extends from the signal PCB opening 170.

After the plate 78 is assembled to the anchor block 76, each signal block opening 168 is aligned with its corresponding cable hole 80 in the anchor block 76.

Each ground contact 74 is captured in a ground through aperture 190. Each ground through aperture 190 has a larger center section 192 that narrows to a smaller ground block opening 194 in the block surface 154 and to a smaller ground PCB opening 196 in the PCB surface 156. The coil 146 of the ground contact 74 is captured in the center section 192. Prior to assembling the plate 78 to the anchor block 76, the block contact point 148 of the ground contact 74 extends from the ground block opening 194. Prior to connecting the connector 14 to the PCB 6, the PCB contact point 150 of the ground contact 74 extends from the ground PCB opening 196.

In the configuration of FIG. 14, the plate 78 has two mirror image sheets 200, 202. The bottom sheet 200 has the PCB openings 170, 196 and half of the center sections 166, 192, and the top sheet 202 has the block openings 168, 194 and half of the center sections 166, 192. The contacts 72, 74 are placed in the center section 166, 192 of one sheet 200 and the sheets 200, 202 are sandwiched together to capture the contacts 72, 74.

In the configuration of FIG. 15, the plate 78 has a bottom sheet 204 with the PCB openings 170, 196 and the entirety of the center sections 166, 192, and a top sheet 206 with only the block openings 168. The contacts 72, 74 are placed in the center section 166, 192 of the bottom sheet 204 and the sheets 204, 206 are sandwiched together to capture the contacts 72, 74.

The plug 162 may be press fit into the through hole 164 in the plate 78 or it may be bonded into the through hole 164 with an adhesive. Alternatively, as shown in FIG. 14, the plug 162 is has two parts 174, 176, each of which fit into one plate sheet 200, 202. Mating shoulders 178, 180 retain the plug parts 174, 176 in the plate sheets 200, 202. Alternatively, as shown in FIG. 15, the plug 162 is has a lower part 182 and an upper part 184, which fit into the lower sheet 204 and upper sheet 206, respectively. Mating shoulders 186, 188 retain the plug parts 182, 184 in the plate sheets 204, 206.

As shown in FIGS. 1 and 2, the connector 14 is removably attached to the PCB 6. Alignment pins 214 extending from the anchor block 76 fit into alignment holes 46 in the PCB 6 to aid in positioning the connector 14 correctly. Optionally, the edge of the alignment holes 46 are beveled to more easily insert the alignment pins 314 into the alignment holes 46.

Jack screws 210 extend through jack screw holes 242 in the strain relief 230 and jack screw holes 86 in the anchor block 76 and turn into threaded holes 44 in the PCB 6 to secure the connector 14 to the PCB 6. The jack screws 210 may not compress the connector 14 and PCB 6 together linearly. The compliant contacts 72, 74 facilitate an adequate connection between the cables 50 and the PCB 6, compensating for noncoplanarities in the signal pads 22 and ground land 30 of the PCB 2.

Figure 16:
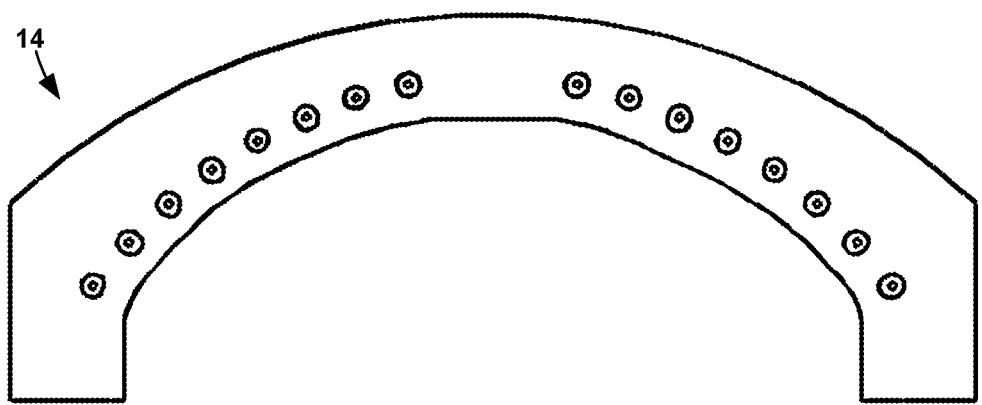
FIG. 16 is a bottom view of curved connector.
Figure 17:
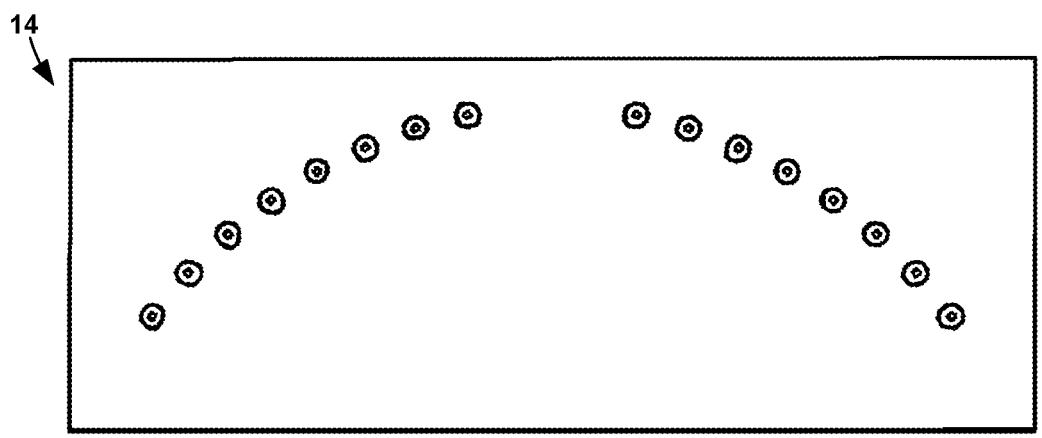
FIG. 17 is a bottom view of rectangular connector.
Figure 18:
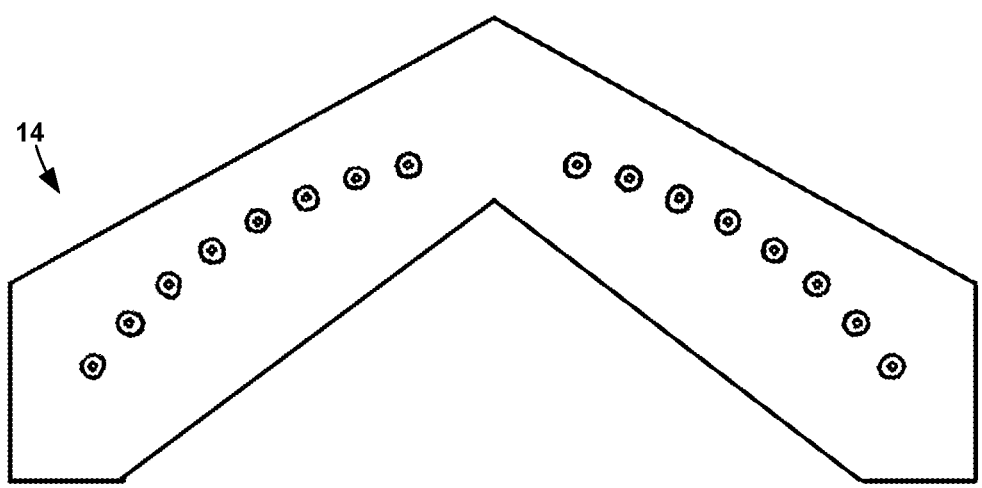
FIG. 18 is a bottom view of chevron connector.

The connector 14 is shaped so that the PCB contact points 144 of the signal contacts 72 are aligned with the signal pads 22 of the PCB 6 when the connector 14 is attached to the PCB 6. Consequently, the PCB contact points 144 trace an arc that is identical to the arc 28 of the signal pads 22. The present invention does not require a particular shape for the connector 14, only that the PCB contact points 144 trace the same arc as the signal pads 22. The connector 14 can be curved, as in FIG. 16, rectangular, as in FIG. 17, a chevron, as in FIG. 18, or any other shape that includes the required arc of PCB contact points 144.

Thus, it has been shown and described controlled-impedance circuit board connections. Since certain changes may be made in the present disclosure without departing from the scope of the present invention, it is intended that all matter described in the foregoing specification and shown in the accompanying drawings be interpreted as illustrative and not in a limiting sense.

The invention claimed is:

1. A connector assembly for removably connecting a plurality of controlled impedance cables to a circuit board, each cable comprising a signal conductor, a dielectric surrounding the signal conductor, and a ground shield surrounding the dielectric, the circuit board having a unit under test with at least three equal length traces radiating therefrom, a signal pad at the end of each trace arranged such that the signal pads extend in an arc about the unit under test, the connector assembly comprising:

(a) an anchor block having a face and at least three cable through holes, each cable through hole having an opening in the face and adapted to accept a controlled-impedance cable such that the at least one center conductor and the dielectric extend to the face;

(b) a plate attached to the face, the plate having a face surface abutting the face and a device surface, the plate including a signal through aperture corresponding to each cable through hole, each signal through aperture extending between a signal block opening in the face surface and a signal device opening in the device surface, the signal block opening being adjacent to and aligned with the opening of its corresponding cable through hole; and (c) an electrically conductive compliant signal contact captured within each of the signal through apertures, the signal contact having a signal block contact point extending from the signal block opening and a signal device contact point extending from the signal device opening; and (d) the device contact points arranged in an arc corresponding to the arc of the signal pads such that, when the connector assembly is connected to the circuit board, each signal device contact point makes electrical contact with a signal pad.

2. The connector assembly of claim 1 wherein the signal contacts are skewed coil contacts.

3. The connector assembly of claim 1 wherein the plate is composed of an electrically conductive material and the signal through aperture is within an insulating plug in the plate.

4. The connector assembly of claim 3 further comprising:
(a) the plate including a plurality of ground through apertures spaced from and surrounding each signal through aperture, each ground through aperture extending between a ground block opening in the face surface and a ground device opening in the device surface; and
(b) an electrically conductive compliant ground contact captured within each ground through aperture, the ground contact having a ground block contact point extending from the ground block opening and a ground device contact point extending from the ground device opening.

5. The connector assembly of claim 4 wherein the ground contacts are skewed coil contacts.

6. The connector assembly of claim 1 wherein the plate is composed of an electrically insulating material and the connector assembly further comprises:
(a) the plate including a plurality of ground through apertures spaced from and surrounding each signal through aperture, each ground through aperture extending between a ground block opening in the face surface and a ground device opening in the device surface; and
(b) an electrically conductive compliant ground contact captured within each ground through aperture, the ground contact having a ground block contact point extending from the ground block opening and a ground device contact point extending from the ground device opening.

7. The connector assembly of claim 6 wherein the signal contacts and the ground contacts are skewed coil contacts.

8. The connector assembly of claim 1 further comprising electrically conductive ferrules adapted to be installed on the ground shield at the end of each cable, each ferrule having a ferrule face and captured in the cable through hole.

9. The connector assembly of claim 8 wherein the ferrules are removably captured in the cable through holes.

10. A connector assembly for removably connecting a plurality of controlled impedance cables to a circuit board the circuit board having a unit under test with at least three equal length traces radiating therefrom, a signal pad at the end of each trace arranged such that the signal pads extend in an arc about the unit under test, the connector assembly comprising:
(a) each controlled-impedance cable having a signal conductor, a dielectric surrounding the signal conductor, and a ground shield surrounding the dielectric;
(b) an anchor block having a face and at least three cable through holes, each cable through hole having an opening in the face and receiving a controlled-impedance cable such that the signal conductor and the dielectric extend to the face;
(c) a plate attached to the face, the plate having a face surface abutting the face and a device surface, the plate including a signal through aperture corresponding to each cable through hole, each signal through aperture extending between a signal block opening in the face surface and a signal device opening in the device surface, the signal block opening being adjacent to and aligned with the opening of its corresponding cable through hole; and
(d) an electrically conductive compliant signal contact captured within each of the signal through apertures, the signal contact having a signal block contact point extending from the signal block opening into electrical contact with the corresponding signal conductor and a signal device contact point extending from the signal device opening; and
(e) the device contact points arranged in an arc corresponding to the arc of the signal pads such that, when the connector assembly is connected to the circuit board, each signal device contact point makes electrical contact with a signal pad.

11. The connector assembly of claim 10 wherein the signal contacts are skewed coil contacts.

12. The connector assembly of claim 10 wherein the plate is composed of an electrically conductive material and the signal through aperture is within an insulating plug in the plate.

13. The connector assembly of claim 12 further comprising:
(a) the plate including a plurality of ground through apertures spaced from and surrounding each signal through aperture, each ground through aperture extending between a ground block opening in the face surface and a ground device opening in the device surface; and
(b) an electrically conductive compliant ground contact captured within each ground through aperture, the ground contact having a ground block contact point extending from the ground block opening and a ground device contact point extending from the ground device opening.

14. The connector assembly of claim 13 wherein the ground contacts are skewed coil contacts.

15. The connector assembly of claim 10 wherein the plate is composed of an electrically insulating material and the connector assembly further comprises:
(a) the plate including a plurality of ground through apertures spaced from and surrounding each signal through aperture, each ground through aperture extending between a ground block opening in the face surface and a ground device opening in the device surface; and
(b) an electrically conductive compliant ground contact captured within each ground through aperture, the ground contact having a ground block contact point extending from the ground block opening and a ground device contact point extending from the ground device opening.

16. The connector assembly of claim 15 wherein the signal contacts and the ground contacts are skewed coil contacts.

17. The connector assembly of claim 10 further comprising electrically conductive ferrules adapted to be installed on the ground shield at the end of each cable, each ferrule having a ferrule face and captured in the cable through hole.

18. The connector assembly of claim 17 wherein the ferrules are removably captured in the cable through holes.

* * * * *